US008958769B1

United States Patent
Razzell

(10) Patent No.: US 8,958,769 B1
(45) Date of Patent: Feb. 17, 2015

(54) DIRECT CONVERSION RECEIVER FOR ANGLE MODULATED SIGNALS

(75) Inventor: Charles John Razzell, Pleasanton, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/601,092

(22) Filed: Aug. 31, 2012

(51) Int. Cl.
| H04B 1/26 | (2006.01) |
| H04B 1/10 | (2006.01) |
| H03D 3/00 | (2006.01) |
| H04L 27/14 | (2006.01) |
| H04B 1/30 | (2006.01) |

(52) U.S. Cl.
CPC ............... H03D 3/00 (2013.01); H03D 3/008 (2013.01); *H04L 27/142* (2013.01); *H04B 1/30* (2013.01)
USPC ............ 455/313; 455/317; 455/323; 455/296

(58) Field of Classification Search
CPC ........... H03D 3/00; H03D 3/008; H04B 1/30; H04L 27/142
USPC ......... 455/205, 208, 210, 296, 311, 312, 313, 455/316, 318, 323, 324
See application file for complete search history.

(56) References Cited

U.S. PATENT DOCUMENTS

| 3,668,673 | A | * | 6/1972 | Adler | 340/870.18 |
| 4,238,850 | A | * | 12/1980 | Vance | 370/278 |
| 4,944,025 | A | * | 7/1990 | Gehring et al. | 455/207 |
| 5,414,736 | A | * | 5/1995 | Hasegawa et al. | 375/334 |
| 5,428,836 | A | * | 6/1995 | Sanecki et al. | 455/315 |
| 5,550,512 | A | * | 8/1996 | Fukahori | 330/254 |
| 5,710,998 | A | | 1/1998 | Opas | |
| 5,715,281 | A | * | 2/1998 | Bly et al. | 375/344 |
| 5,983,081 | A | * | 11/1999 | Lehtinen | 455/76 |
| 6,868,128 | B1 | * | 3/2005 | Lane | 375/319 |
| 6,992,614 | B1 | * | 1/2006 | Joyce | 342/122 |
| 7,236,762 | B2 | * | 6/2007 | Asikainen et al. | 455/323 |
| 8,121,575 | B2 | * | 2/2012 | Ruijter | 455/296 |
| 2001/0041542 | A1 | * | 11/2001 | Manku et al. | 455/86 |
| 2003/0193923 | A1 | * | 10/2003 | Abdelgany et al. | 370/342 |
| 2006/0019622 | A1 | * | 1/2006 | Domino et al. | 455/189.1 |
| 2006/0111071 | A1 | * | 5/2006 | Paulus et al. | 455/302 |
| 2009/0098848 | A1 | * | 4/2009 | Ruijter | 455/337 |

FOREIGN PATENT DOCUMENTS

| EP | 0647016 | * | 4/1995 | H03D 7/16 |
| JP | 9-200072 | * | 7/1997 | H04B 1/30 |

* cited by examiner

Primary Examiner — Duc M Nguyen
(74) Attorney, Agent, or Firm — Tips Group

(57) ABSTRACT

A direct conversion receiver including an input stage, a frequency modulated local oscillator, a mixer stage, an output stage, and a DC blocker stage coupled between the mixer stage and the output stage. The input stage is receptive to a frequency modulated transmission having a carrier frequency $f_c$ and the frequency modulated local oscillator provides a frequency modulated local oscillator signal. In an embodiment, the frequency modulated local oscillator includes a local oscillator having an output with a frequency approximately equal to $f_c$, a modulation source having a modulation signal output, and a frequency modulator coupled to the outputs of the local oscillator.

20 Claims, 4 Drawing Sheets

DIRECT CONVERSION RECEIVER FOR ANGLE MODULATED SIGNALS

BACKGROUND

Direct conversion receivers, otherwise known as homodyne, synchrodyne, or zero IF receivers, have recently gained popularity for the reception of FM and other angle modulated signals due to their simplicity and potential for monolithic construction in integrated circuitry. They employ a radio receiver design that demodulates the incoming radio signal using mixer detection driven by a local oscillator whose frequency is equal to the carrier frequency of the signal being received.

The direct-conversion receiver feeds the radio signal into a frequency mixer, just as in a superheterodyne receiver, where it is mixed with a local oscillator signal. However, unlike the superheterodyne, the frequency of the local oscillator is set to the received signal's carrier frequency. The result is a demodulated output where the conversion to baseband is done in a single frequency conversion, avoiding the complexity of the superheterodyne's two (or more) frequency conversions, IF stage(s), and image rejection issues.

However, there are potential problems with the direct conversion receiver design. Signal leakage paths can occur where local oscillator energy can leak through the mixer stage and feed back to the antenna input where it reenters the mixer stage. The overall effect is that the local oscillator energy self-mixes and creates a DC offset signal. The offset can be large enough to overload the baseband amplifiers and swamp the wanted signal reception. To address these limitations, direct conversion receivers have typically include high pass filters, DC blocking capacitors, DC servo controllers, or other means to offset or remove the DC component. These DC blocking or offsetting components will produce a low frequency response cutoff point, reducing the magnitude of any information in the baseband below that low frequency response point. This phenomena is sometimes referred to as "the hole at DC" or "the hole in the middle". For certain narrow band frequency modulation schemes, this low frequency cutoff will result in a significant loss of baseband information, resulting in increased distortion in the demodulated signal.

FIG. 1 is a block diagram of a conventional direct conversion receiver 100. The FM signal having a carrier frequency of $f_c$ enters the direct conversion receiver at antenna 102, is filtered by a bandpass filter 104, and is amplified by an amplifier 106. Following amplifier 106, the signal is split by a power divider 108 into two identical (except for amplitude) components. One component is sent to a mixer 114 and the other component sent to a mixer 116. A local oscillator 110, set to a frequency of $f_c$, is split into two signals of different phase by phase splitter 112. The zero phase angle component leaving phase splitter 112 is directed to mixer 116, and the −90 degree phase angle component leaving phase splitter 112 is directed to mixer 114. The baseband components leaving mixers 116 and 114 are directed to high pass filters 120 and 118, respectively.

Hi pass filters 118 and 120 may be simple blocking capacitors, multi-component filter structures, DC servo feedback devices, etc., which will be referred to herein as "DC blockers." The purpose of the DC blockers is to greatly attenuate ("remove") DC created by leakage and feedback of local oscillator frequency $f_c$ that re-enters the circuitry via antenna 102 or mixers 114, 116. However, any DC blocker utilized in components 118 and 120 will have a cutoff frequency, above which it will substantially pass AC signals, and below which it begins to substantially attenuate them. If there are any low frequency components within the baseband that are below the cutoff frequency, they will be attenuated by the high pass filters 118 and 120, resulting in a loss of information in the demodulated baseband. Following high pass filters 118, 120, the signals are processed by low pass filters 122, 124, amplifiers 126, 128, and low pass filters 130, 132. The quadrature outputs are recombined in a device 134.

FIG. 2 is a graph 200 of SINAD as a function of Signal to Noise Ratio (SNR) for the typical prior art direct conversion receiver of FIG. 1. SINAD is the abbreviation for "signal noise and distortion" ratio, defined as $[P_{signal}+P_{noise}+P_{distortion}]/[P_{noise}+P_{distortion}]$, where $P_{signal}$, $P_{noise}$, and $P_{distortion}$ refer to signal power, noise power, and the power of the distortion components, respectively. The signal to noise ratio is commonly defined as $SNR=P_{signal}/P_{noise}$. Curve 202 is obtained by sweeping the signal strength of a 1 KHz modulation tone FM signal (fed to antenna 102 of the circuit in FIG. 1) to create signal to noise ratios from 2 dB to 32 dB, while determining the SINAD values for the corresponding SNR. As can be seen, a limiting maximum value of the SINAD is about 24 dB, and has reached this value after SNR values of about 12-13 dB, for the conventional direct conversion receiver of FIG. 1.

FIG. 3 is a spectrum diagram 300 for the direct conversion receiver of FIG. 1 which illustrates the above-described performance problems due to the influence of distortion components. Curve 302 is the spectrum analysis plot of the same 1 KHz modulation tone FM signal used in FIG. 2. The spectrum analysis plot 302 shows two dominant peaks, one at 1 KHz (the fundamental tone) and one at 3 KHz, which is the third harmonic distortion level. This level of harmonic distortion is quite significant (being about −30 dB below the fundamental 1 KHz level) and explains the low level of SINAD of FIG. 2.

Prior attempts to address this problem include offsetting the local oscillator frequency by a fixed amount, typically close to that of the low frequency cutoff point of the DC blocking high pass filter. Since the cutoff frequencies may be on the order of a few Hertz to a few hundred Hz, control of the local oscillator $f_c$ to this level of precision is difficult, particularly if it must be maintained over a long period of time and ambient temperature variations.

These and other limitations of the prior art will become apparent to those of skill in the art upon a reading of the following descriptions and a study of the several figures of the drawing.

SUMMARY

In an embodiment, set forth by way of example and not limitation, a direct conversion receiver includes an input stage, a frequency modulated local oscillator, a mixer stage, an output stage, and a DC blocker stage coupled between the mixer stage and the output stage. In this example, the input stage has an input and an output, the input being receptive to a frequency modulated transmission having a carrier frequency $f_c$ and the frequency modulated local oscillator provides a frequency modulated local oscillator signal. In an example embodiment, the frequency modulated local oscillator includes a local oscillator having an output with a frequency approximately equal to $f_c$, a modulation source having a modulation signal output, and a frequency modulator coupled to the outputs of the local oscillator. The mixer stage has inputs coupled to the output of the input stage and the output of the frequency modulated local oscillator.

In an embodiment, set forth by way of example and not limitation, a method for receiving angle modulated signals includes: receiving a frequency modulated transmission by an input stage of a direct conversion receiver, the frequency modulated transmission having a carrier frequency $f_c$; directing the frequency modulated transmission from the input stage to a first input of a mixer stage; providing a frequency modulated local oscillator signal to a second input of the mixer stage; and attenuating DC components of an output signal of the mixer stage. In a non-limiting example, the frequency modulated local oscillator signal is developed by; a) providing a local oscillator signal having a frequency approximately equal to $f_c$; (b) providing a modulation signal; and (c) frequency modulating the local oscillator signal with the modulation signal.

An advantage of certain example embodiments is that distortion elements can be greatly reduced in direct conversion receivers. A further advantage of certain example embodiments is that the signal noise and distortion (SINAD) ratio as a function of signal to noise ratio (SNR) can be improved.

These and other embodiments and advantages will become apparent to those of skill in the art upon a reading of the following descriptions and a study of the several figures of the drawings.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
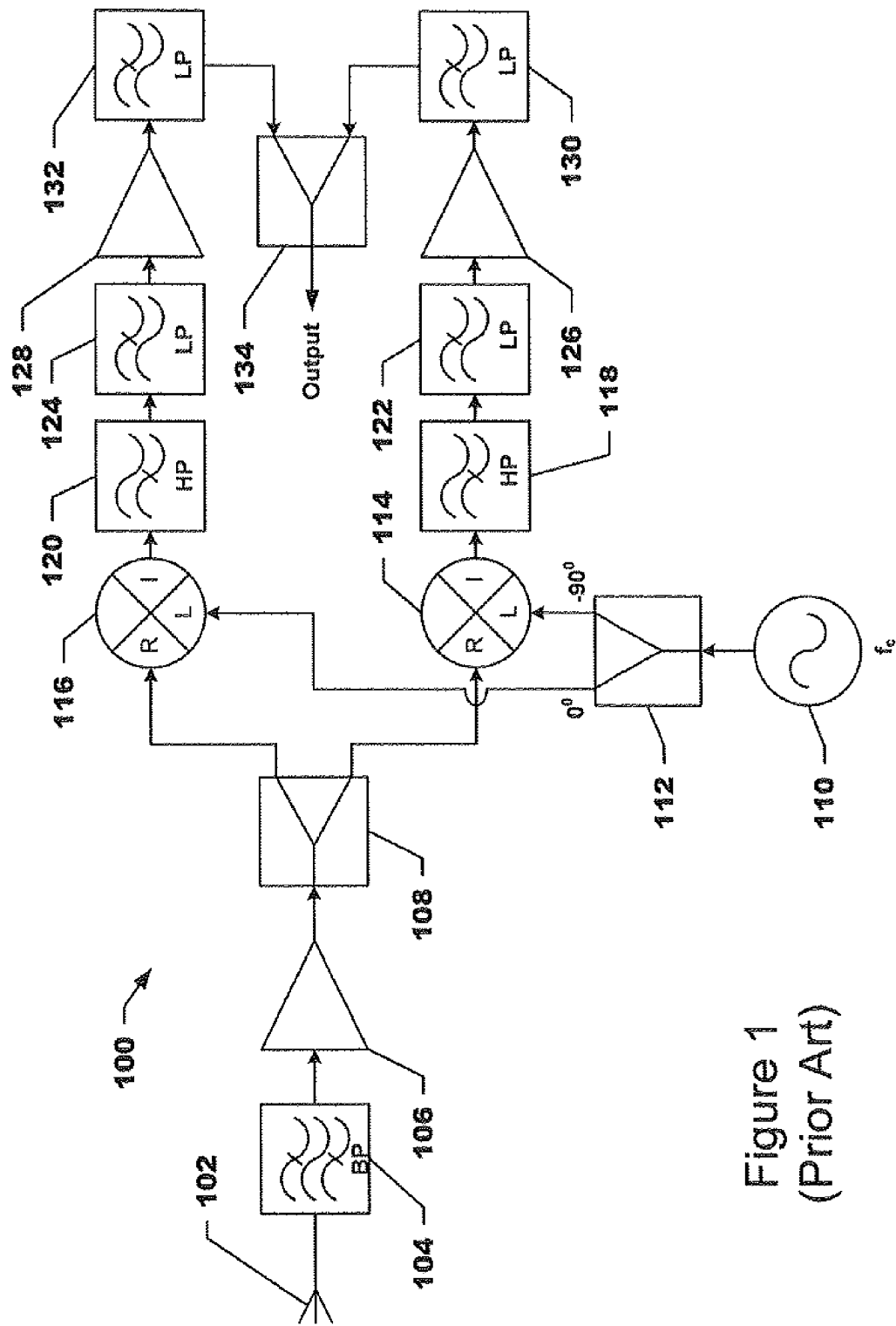
FIG. 1 is a block diagram of a conventional direct conversion receiver.
Figure 2:
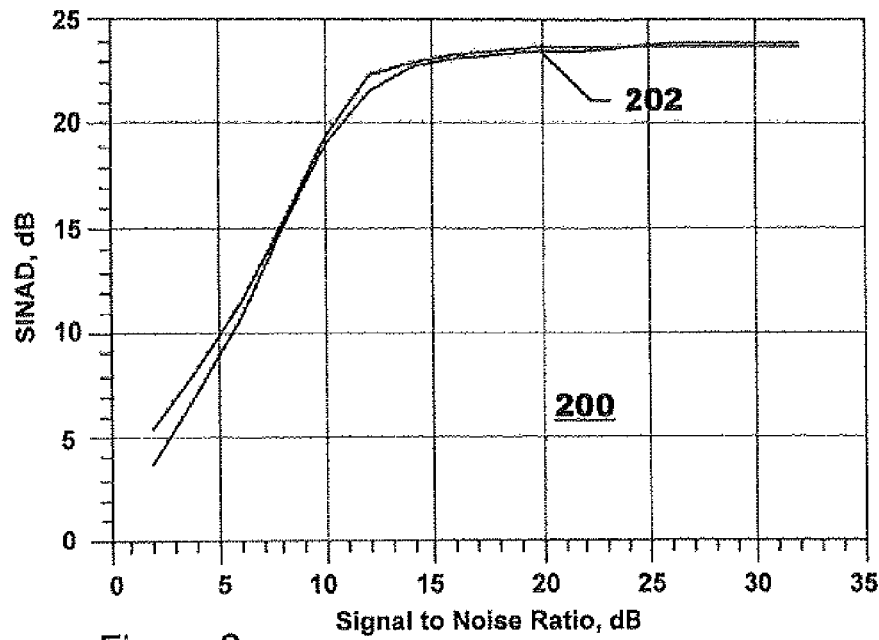
FIG. 2 is a graph of SINAD as a function of Signal to Noise Ratio (SNR) for a conventional direct conversion receiver of FIG. 1.
Figure 3:
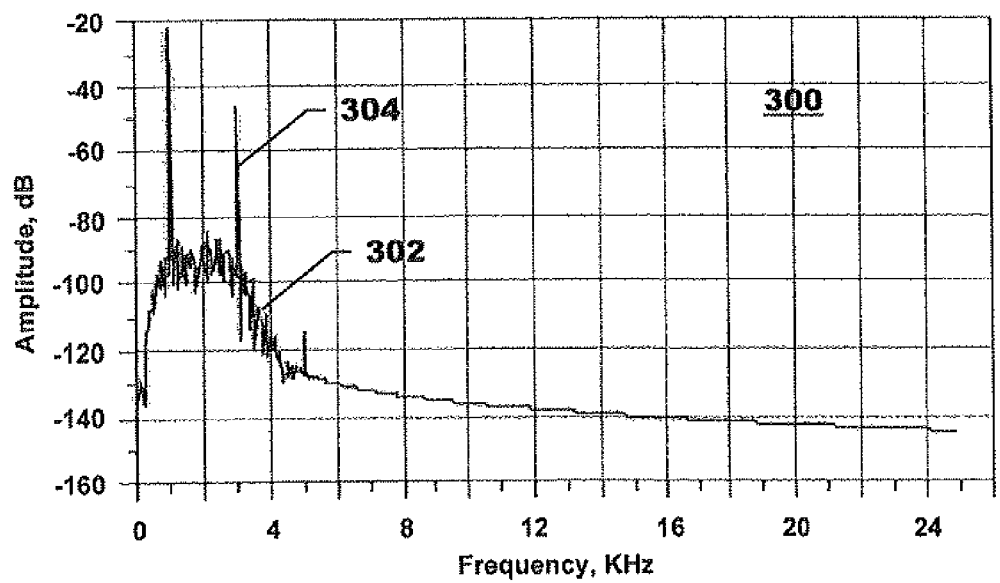
FIG. 3 is a spectrum analysis of a received audio spectrum of a conventional direct conversion receiver of FIG. 1.
Figure 4:
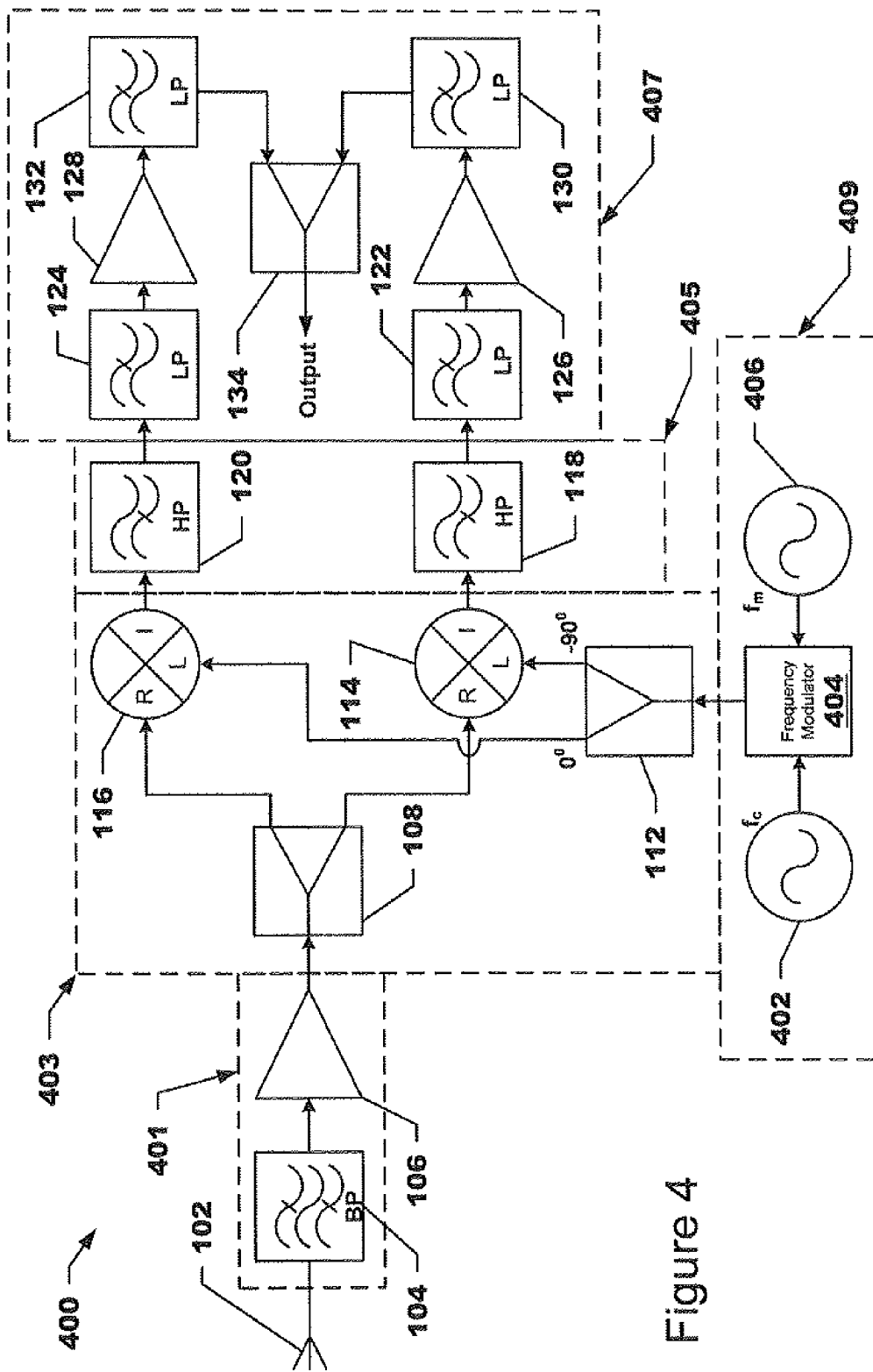
FIG. 4 is a block diagram of an example improved direct conversion receiver.

FIGS. 1-3 were described with respect to the prior art. FIG. 4 is block diagram of an improved direct conversion angle modulated ("FM") receiver ("receiver") 400. To the extent that components of receiver 400 of FIG. 4 are similar to those of prior art receiver 100 of FIG. 1 the same reference numerals will be used in both figures. In this example embodiment, receiver 400 includes an input stage 401, a mixer stage 403, a DC blocker stage 405, an output stage 407, and a frequency modulated local oscillator 409. The circuitry of receiver 400, in an embodiment, is implemented as an integrated circuit.

In FIG. 4, an FM signal having a carrier frequency of $f_c$ enters the receiver 400 at antenna 102, is filtered by a bandpass filter 104, and is then amplified by an amplifier 106. Following amplifier 106, the signal is split by power divider 108 into two identical (except for amplitude) components. One component is sent to a mixer 116 and the other component sent to a mixer 114. A modulated local oscillator 409, in this example, has one output that is split into two signals of different phase by phase splitter 112. By way of non-limiting example, a first output of phase splitter 112 can be a zero (0) phase angle component that can be coupled to mixer 116, and a second output of phase splitter 112 can be a minus-ninety (−90) degree phase angle component that can be coupled to mixer 114. In alternate embodiments, the phase angle components at the first output and second output of phase splitter 112 can be different than in the preceding non-limiting example as long as they are substantially in quadrature with respect to each other. The baseband components leaving mixers 116 and 114 are directed to high pass filters 120 and 118, respectively.

As described previously, high pass filters 118 and 120 may be simple blocking capacitors, multi-component filter structures, or DC servo feedback devices. Their purpose is to substantially attenuate ("remove") DC created by leakage and feedback of local oscillator frequency $f_c$ that re-enters the circuitry via antenna 102 or mixers 114, 116. For example, in a simple first-order continuous-time high pass filter comprising the series combination of a resistor and a capacitor where the output is taken across the resistor, the cutoff frequency is considered to be the point at which the output power is one half or the input power. Following high pass filters 118, 120, the signals are processed by low pass filters 122, 124, amplifiers 126, 128, and low pass filters 130, 132. The quadrature outputs are recombined in device 134 to provide the output from receiver 400.

Modulated local oscillator 409 includes a modulator 404, a local oscillator 402 and a modulation source 406. Local oscillator 402 provides the carrier signal at a frequency of $f_c$, and modulation 406 provides the modulation signal having an amplitude δ corresponding to the desired degree of frequency deviation of carrier frequency $f_c$, and a frequency $f_m$ corresponding to the rate of deviation. As one example, frequency modulator may produce a modulated signal having a carrier frequency $f_c$ modulated +/−200 Hz at a rate of 10 Hz.

The effect of replacing the local oscillator 110 of FIG. 1 having a fixed frequency $f_c$, with the modulated local oscillator 409 of FIG. 4 is to "spread" any low frequency components to a bandwidth higher than the high pass cutoff frequency of filters 118 and 120, reducing the effective average attenuation of these components, and improving overall distortion performance of the receiver.

It should be noted that the frequency deviation (amplitude of signal leaving oscillator 406) and modulation frequency $f_m$ can be adjustable parameters. For a given source signal (being received) and a given design of high pass/DC blocking devices 118, 120, frequency deviation and modulation frequency $f_m$ can be adjusted to minimize particular distortion components in the demodulated baseband.

Figure 5:
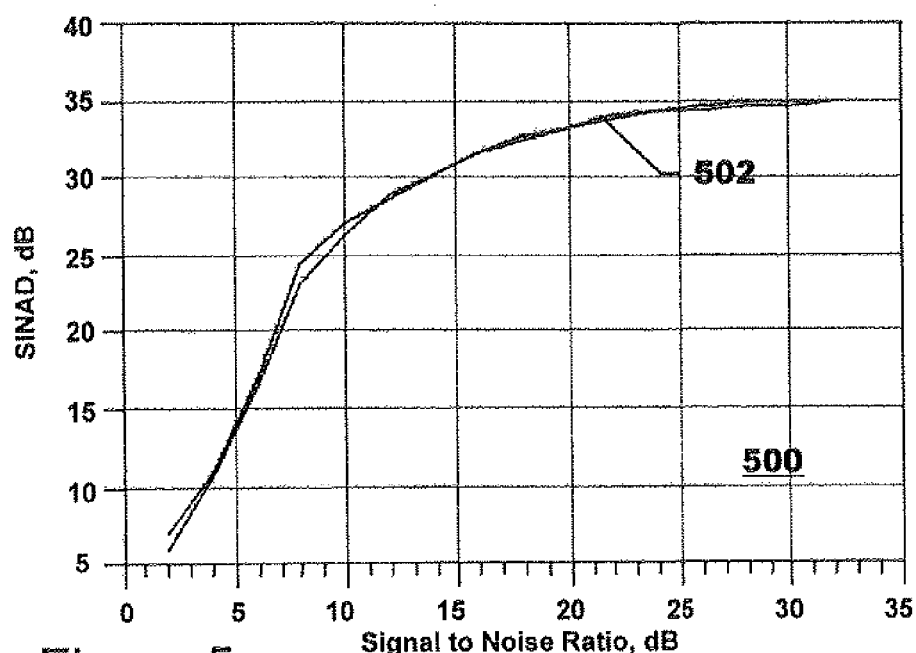
FIG. 5 is a graph of SINAD as a function of Signal to Noise Ratio (SNR) for the example direct conversion receiver of FIG. 4.

Modulation frequency $f_m$ is preferably chosen so that the modulation effect remains inaudible to the listener, typically within the range of 10-15 Hz. Frequency deviation of $f_c$ is typically between the high pass cutoff frequency of filters 118, 120 and 400—300 Hz. Frequency modulator 404 may be constructed of conventional circuitry such as a voltage controlled oscillator (VCO), or may be implemented as part of a fractional-n synthesizer such as for example, Maxim Corporation's MAX2870 Fractional-n synthesizer monolithic integrated circuit, FIG. 5 is a graph 500 of SINAD as a function of Signal to Noise Ratio (SNR) for the example direct conversion receiver of FIG. 4 when a 1 KHz modulation tone FM signal is applied. In this example, the signal from frequency modulator 404 was modulated by a peak deviation of +/−200 Hz at a rate of 10 Hz. Curve 502 shows the limiting value of the SINAD has increased from 24 dB for receiver 100 (as seen in FIG. 2) to 35 dB for receiver 400, due to a significant reduction in distortion.

Figure 6:
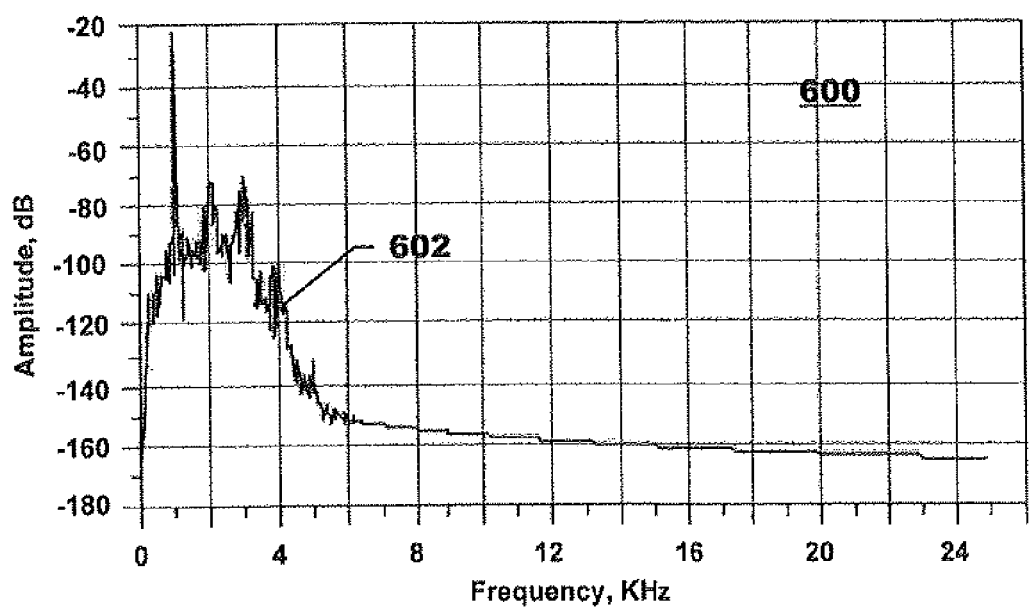
FIG. 6 is a spectrum analysis of a received audio spectrum of the example direct conversion receiver of FIG. 4.

FIG. 6 illustrates a spectrum analysis 600 for the example receiver 400 of FIG. 4. Note that curve 602 shows considerably reduced 3 harmonic distortion, which is now −50 to −60 dB below the level of the fundamental 1 KHz tone.

As will be appreciated from the forgoing discussion, a method for receiving angle modulated signals includes the operations of: (a) receiving a frequency modulated transmission by an input stage of a direct conversion receiver, the frequency modulated transmission having a carrier frequency $f_c$; (b) directing the frequency modulated transmission from the input stage to a first input of a mixer stage; (c) providing a frequency modulated local oscillator signal to a second input of the mixer stage; and (d) attenuating DC components of an output signal of the mixer stage. In an example embodiment, providing a frequency modulated oscillator signal includes: (a) providing a local oscillator signal having a frequency approximately equal to $f_c$; (b) providing a modulation signal; and (c) frequency modulating the local oscillator signal with the modulation signal. In an embodiment, the frequency modulated oscillator signal has a modulation frequency deviation of $\delta$ and at a rate of $f_m$, where $\delta$ and $f_m$ are chosen to reduce harmonic distortion of signals. In certain embodiments, a modulation frequency deviation $\delta$ can be chosen to substantially exceed a high pass corner of the post-mixer filters and a rate $f_m$ can be chosen that is low enough to have only a minimal impact on the quality of the useful information carried by the modulation. In the previously cited, non-limiting example, $\delta$ can be approximately +/−200 Hz and $f_m$ can be approximately 10 Hz.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A direct conversion receiver to demodulate a received frequency modulated transmission comprising:
    an input stage having an input and an output, said input being receptive to a frequency modulated transmission having a carrier frequency $f_c$ during operation of said direct conversion receiver;
    a frequency modulated local oscillator providing a frequency modulated local oscillator signal, said frequency modulated local oscillator including a local oscillator having an output with a frequency approximately equal to $f_c$, a modulation source having a modulation signal output, and a frequency modulator coupled to said outputs of said local oscillator and said modulation source and providing said frequency modulated local oscillator signal;
    a mixer stage having inputs coupled to said output of said input stage and said output of said frequency modulated local oscillator to demodulate said frequency modulated transmission having said carrier frequency $f_c$ responsive to reception of said frequency modulated transmission having said carrier frequency $f_c$ during operation of said direct conversion receiver to produce a demodulated signal;
    an output stage; and
    a DC blocker stage coupled between said mixer stage and said output stage, said DC blacker stage having a cutoff frequency;
    wherein said modulation source provides the modulation signal having an amplitude $\delta$ corresponding to a desired degree of frequency deviation of the carrier frequency $f_c$ and a frequency $f_m$ corresponding to a rate of deviation;
    wherein said frequency modulated local oscillator signal spreads low frequency components to a bandwidth higher than said cutoff frequency of said DC blocker stage during operation of said direct conversion receiver;
    wherein $\delta$ and $f_m$ are adjusted to reduce attenuation of said low frequency components within a baseband below said cutoff frequency of said DC blocker stage; and
    wherein effective average attenuation of said low frequency components is reduced and overall distortion performance of said direct conversion receiver is improved.

2. A direct conversion receiver as recited in claim 1 wherein said frequency modulated local oscillator signal has a modulation frequency deviation of $\delta$ and at a rate of $f_m$, where $\delta$ and $f_m$ are chosen to minimize harmonic distortion of signals in said DC blocker stage.

3. A direct conversion receiver as recited in claim 2 wherein said frequency modulated local oscillator signal has a modulation frequency deviation $\delta$ of approximately +/−200 Hz and a rate $f_m$ of approximately 10 Hz.

4. A direct conversion receiver as recited in claim 1 wherein said input stage of said direct conversion receiver comprises a band pass filter and an amplifier.

5. A direct conversion receiver as recited in claim 4 wherein said mixer stage comprises a power divider, a phase splitter, a first mixer, and a second mixer, said power divider having first and second outputs, said phase splitter having first and second outputs that are substantially in quadrature with each other, said first mixer having first and second inputs, said second mixer having first and second inputs, said first output of said power divider coupled to said first input of said first mixer, said second output of said power divider coupled to said first input of said second mixer, said first output of said phase splitter coupled to said second input of said first mixer, said second output of said phase splitter coupled to said second input of said second mixer.

6. A direct conversion receiver as recited in claim 5 wherein said amplifier of said input stage is coupled to an input of said power divider of said mixer stage.

7. A direct conversion receiver as recited in claim 6 wherein said frequency modulated local oscillator signal is coupled to an input of said phase splitter.

8. A direct conversion receiver as recited in claim 7 wherein said DC blocking stage includes a plurality of DC blockers including a first DC blocker coupled to an output of said first mixer and a second DC blocker coupled to an output of said second mixer, said plurality of DC blockers having cutoff frequencies below which signals are substantially attenuated.

9. A direct conversion receiver as recited in claim 8 wherein said plurality of DC blockers are high pass filters.

10. A direct conversion receiver as recited in claim 8 wherein said plurality of DC blockers are servo loop controllers.

11. A direct conversion receiver as recited in claim 1 wherein said frequency modulated local oscillator comprises a fractional-n synthesizer.

12. A method for receiving angle modulated signals comprising:

receiving a frequency modulated transmission by an input stage during operation of a direct conversion receiver, said frequency modulated transmission having a carrier frequency $f_c$;

directing said frequency modulated transmission from said input stage to a first input of a mixer stage;

providing a frequency modulated local oscillator signal to a second input of said mixer stage to demodulate said frequency modulated transmission having said carrier frequency $f_c$ responsive to reception of said frequency modulated transmission having said carrier frequency $f_c$ during operation of said direct conversion receiver to produce a demodulated signal by: a) providing a local oscillator signal having a frequency approximately equal to $f_c$; (b) providing a modulation signal; and (c) frequency modulating said local oscillator signal with said modulation signal; and attenuating low frequency components of the demodulated signal of said mixer stage less than or equal to a cutoff frequency of a DC blocker stage;

wherein said modulation signal has an amplitude δ corresponding to a desired degree of frequency deviation of the carrier frequency $f_c$ and a frequency $f_m$ corresponding to a rate of deviation;

wherein said frequency modulated local oscillator signal spreads low frequency components to a bandwidth higher than said cutoff frequency of said DC blocker stage during operation of said direct conversion receiver;

wherein δ and $f_m$ are adjusted to reduce attenuation of said low frequency components within a baseband below said cutoff frequency of said DC blocker stage; and wherein effective average attenuation of said low frequency components is reduced and overall distortion performance of said direct conversion receiver is improved.

13. A method for receiving angle modulated signals as recited in claim 12 wherein said frequency modulated local oscillator signal has a modulation frequency deviation of δ and at a rate of $f_m$, where δ and $f_m$ are chosen to minimize harmonic distortion of signals.

14. A method for receiving angle modulated signals as recited in claim 13 wherein said frequency modulated local oscillator signal has a modulation frequency deviation δ of approximately +/−200 Hz and a rate $f_m$ of approximately 10 Hz.

15. A method for receiving angle modulated signals as recited in claim 14 wherein said input stage of said direct conversion receiver comprises a band pass filter and an amplifier.

16. A method for receiving angle modulated signals as recited in claim 15 wherein said mixer stage of said direct conversion receiver comprises a power divider, a phase splitter, a first mixer, and a second mixer, said power divider having first and second outputs, said phase splitter having a first output and a second output, where said first output and said second output are substantially in quadrature with each other, said first mixer having first and second inputs, said second mixer having first and second inputs, said first output of said power divider coupled to said first input of said first mixer, said second output of said power divider coupled to said first input of said second mixer, said first output of said phase splitter coupled to said second input of said first mixer, said second output of said phase splitter coupled to said second input of said second mixer.

17. A method for receiving angle modulated signals as recited in claim 16 wherein said frequency modulated transmission is directed from said amplifier of said input stage to an input of said power divider of said mixer stage and wherein said frequency modulated local oscillator signal is directed to an input of said phase splitter.

18. A method for receiving angle modulated signals as recited in claim 17 wherein said direct conversion receiver has a DC blocker stage coupled to outputs of said first mixer and said second mixer, said DC blocker stage having a cutoff frequency below which signals passing through said DC blocker stage are substantially attenuated.

19. A method for receiving angle modulated signals as recited in claim 18 wherein said DC blocker stage comprises one or more of a high pass filter and a servo loop controller.

20. A method for receiving angle modulated signals as recited in claim 12 wherein said frequency modulated local oscillator signal is generated by a fractional-n synthesizer.

* * * * *